(12) United States Patent
Uchida (10) Patent No.: US 6,404,666 B1
(45) Date of Patent: Jun. 11, 2002

(54) READ ONLY MEMORY HAVING CORRECTION CURRENT SUPPLYING CIRCUIT

(75) Inventor: Hirofumi Uchida, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/662,650

(22) Filed: Sep. 14, 2000

(30) Foreign Application Priority Data

Feb. 28, 2000 (JP) ........................................ 2000-051527

(51) Int. Cl.$^7$ ............................................... G11C 17/00
(52) U.S. Cl. ........................ 365/104; 365/208; 365/210
(58) Field of Search ........................... 365/94, 104, 210, 365/207, 208

(56) References Cited

U.S. PATENT DOCUMENTS

| 4,458,348 A | * | 7/1984 | Fukuda et al. ............. 365/104 |
| 4,661,927 A | * | 4/1987 | Graebel ...................... 365/175 |
| 6,072,734 A | * | 6/2000 | Choi ........................... 365/194 |
| 6,088,277 A | * | 7/2000 | Kim et al. ................... 365/207 |

* cited by examiner

Primary Examiner—Son Mai
(74) Attorney, Agent, or Firm—Volentine Francos, PLLC (57) ABSTRACT

A read only memory (ROM) capable of eliminating effects of off leak current of non-selected memory cells so as to prevent read errors in a large scale ROM. The ROM comprises word lines WL1-n activated in response to an address signal, sense lines CL1-m intersected with the word lines WL1-n and selected in response to a selection signal SL1-m,r, a reference sense line CLr intersected with the word lines WL1-n, memory cells $1_{m,n}$ storing data therein, reference memory cells $5_{1-n}$ connected to the reference sense line CLr, a sense amplifier 9 for comparing currents flowing on the selected one of the sense lines CL1-n and on the reference sense line CLr. The ROM further comprises a correction current supply circuit 40 connected to the sense lines CL1-n and the reference sense line CLr. The correction current supply circuit 40 generates a correction current approximately corresponding to a leak current flowing through the memory cells $1_{m,n}$ connected to the selected one of the sense lines CL1-n and provides the correction current to the sense lines CL1-n and the reference sense line CLr.

19 Claims, 5 Drawing Sheets

ROM ACCORDING TO FIRST EMBODIMENT OF THE INVENTION

CONVENTIONAL ROM

FIG.3

ROM ACCORDING TO SECOND EMBODIMENT OF THE INVENTION

FIG.4 ROM ACCORDING TO THIRD EMBODIMENT OF THE INVENTION

READ ONLY MEMORY HAVING CORRECTION CURRENT SUPPLYING CIRCUIT

BACKGROUND OF THE INVENTION

The present invention relates to a read only memory (hereinafter, referred to as "ROM"), and more particularly to a read error preventive technology in a large scale ROM.

Figure 2:
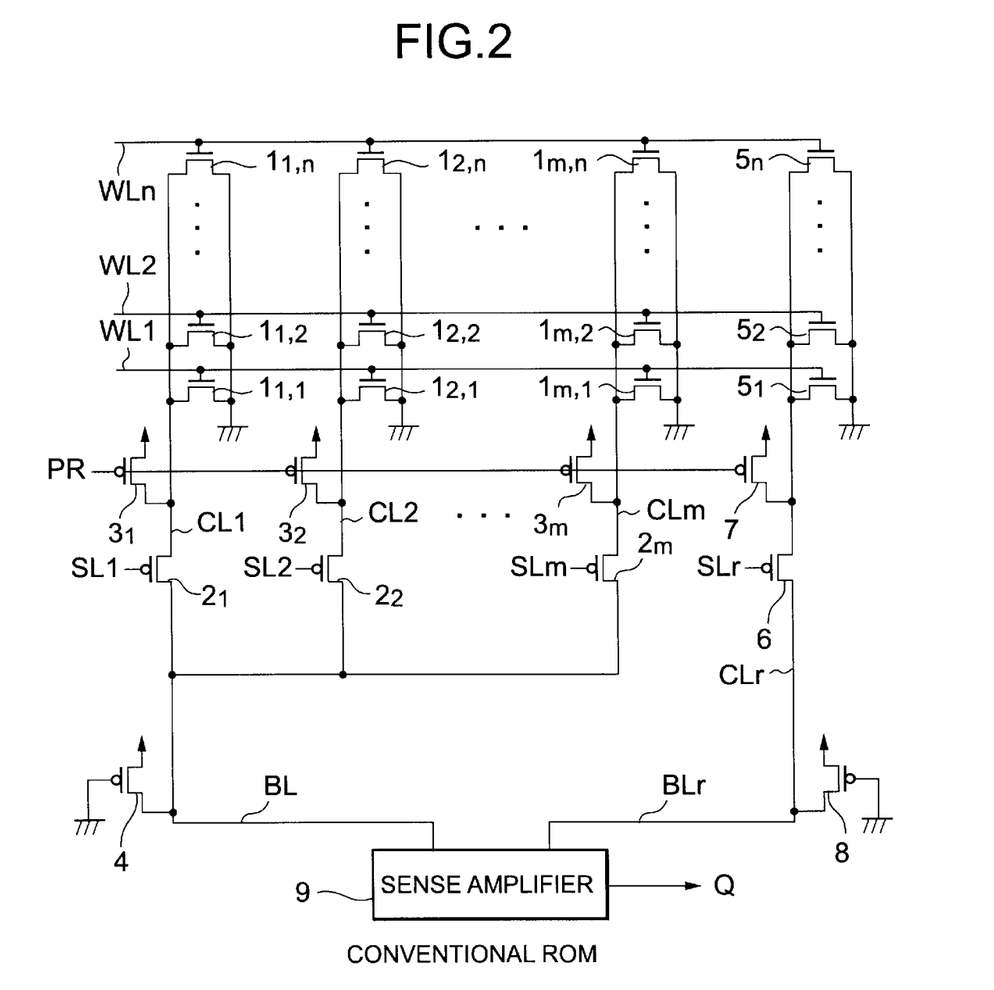
FIG. 2 is a schematic diagram of a conventional ROM.

Referring to FIG. 2, there is shown a schematic constitutional diagram of a conventional ROM.

The conventional ROM has column lines CLi (i=1 to m) and word lines WLj (j=1 to n) arranged intersecting the column lines. At intersections between the column lines CLi and the word lines WLj, memory cells $1_{i,j}$ formed by N-channel insulated gate transistors (hereinafter, an insulated gate transistor is referred to as "MOS" and an N-channel MOS is as "NMOS") are selectively arranged and drains of the memory cells $1_{i,j}$ are connected to the column lines CLi and gates of the memory cells are connected to the word lines WLj. Sources of the memory cells $1_{i,j}$ are connected to ground potential GND via a conductive line.

Respective column lines CLi are connected in common to a bit line BL via P-channel MOS (hereinafter, referred to as "PMOS") transistors $2_i$. Selection signals SLi are given to gates of the respective PMOS transistors $2_i$ for selecting one of the PMOS transistors $2_i$ so as to be set on. Furthermore, respective column lines CLi are connected to a power supply potential VCC via PMOS transistors $3_i$ controlled in common by a pre-charge signal PR. The bit line BL is connected to the power supply potential VCC via a PMOS transistor 4 which is constantly on.

The ROM has a reference column line CLr arranged intersecting word lines WLj. At each intersection between the reference column line CLr and each word line WLj, each reference memory cell 5j formed by an NMOS transistor is arranged and a drain of the reference memory cell 5j is connected to the reference column line CLr and its gate is connected to the word line WLj. A source of each reference memory cell 5j is connected to ground potential GND. The column line CLr is connected to a reference bit line BLr via a PMOS transistor 6 controlled by a selection signal SLr and connected to the power supply potential VCC via a PMOS transistor 7 controlled by the pre-charge signal PR. The reference bit line BLr is connected to the power supply VCC via a PMOS transistor 8 which is constantly on.

The bit line BL and the reference bit line BLr are connected to a sense amplifier 9. The sense amplifier 9 amplifies an electric potential difference between the bit line BL and the reference bit line BLr and outputs a status of a selected memory cell $1_{i,j}$ as an output signal Q.

In the conventional ROM, each memory cell $1_{i,j}$ is set to a logical value "0" or "1" at manufacturing. For example, in a contact ROM, a conductive line between a source of a memory cell $1_{i,j}$ and the ground potential GND is connected in a contact layer and the memory cell is set to "1," while the sources are disconnected from the ground potential GND without a formation of the contact layer and the memory cell is set to "0." Therefore, if the selected memory cell $1_{i,j}$ is set to "1," the memory cell $1_{i,j}$ is set on, by which current flows. If it is set to "0," the current does not flow. On the other hand, all of the reference memory cells 5j are set to '1.'

Next, an operation is described below.

In the conventional ROM, for example, it is assumed that a memory cell $1_{1,1}$ is set to "0" and memory cells $1_{1,2}$ to $1_{1,n}$ are set to "1," respectively.

If a level "L" is given to selection signals SL1 and SLr to select the column line CL1 and the reference column line CLr and the word line WL1 is selected to give a level "H," the memory cell $1_{1,1}$ is read out to the bit line BL and the reference memory cell $5_1$ is to the reference bit line BLr, respectively. As the memory cell $1_{1,1}$ is set to "0," no current flows through the memory cell $1_{1,1}$. In addition, memory cells $1_{1,2}$ to $1_{1,n}$ connected in parallel between the column line CL1 and the ground potential GND are set off since they are not selected, and therefore the electric potential of the bit line BL is substantially equal to the power supply potential VCC.

On the other hand, all of the reference memory cells $5_1$ to $5_n$ are set to "1" and therefore the reference memory cell $5_1$ selected by the word line WL1 is set on and other non-selected reference memory cells $5_2$ to $5_n$ are set off. Therefore, an electric potential of the reference bit line BLr is substantially equal to an electric potential obtained by dividing the power supply potential VCC by "on" resistance of the PMOS transistors 8 and 6 and of the reference memory cell $5_1$. An electric potential difference between the bit line BL and the reference bit line BLr is amplified by the sense amplifier 9. In the case the electric potential of the bit line BL is higher than that of the reference bit line BLr, and therefore a content of the selected memory cell $1_{1,1}$ is judged to be "0" and an output signal Q of "L" is output from the sense amplifier 9.

Next, if a word line WL2 is selected and "H" is given, the memory cell $1_{1,2}$ is read out to the bit line BL and the reference memory cell $5_2$ is to the reference bit line BLr, respectively. The memory cell $1_{1,2}$ is set to "1" and therefore the memory cell $1_{1,2}$ is set on. Other memory cells $1_{1,3}$ to $1_{1,n}$ connected in parallel between the column line CL1 and the ground potential GND, which are not selected, are set off. Accordingly, the electric potential of the bit line BL is substantially equal to an electric potential obtained by dividing the power supply potential VCC by "on" resistance of the PMOS transistors 4 and $2_1$ and of the memory cell $1_{1,2}$.

On the other hand, the electric potential of the reference bit line BLr is substantially equal to an electric potential obtained by dividing the power supply potential VCC by "on" resistance of the PMOS transistors 8 and 6 and of the reference memory cell $5_2$. In the case the electric potential of the bit line BL is substantially equal to that of the reference bit line BLr, and therefore a content of the selected memory cell $1_{1,1}$ is judged to be "1" by the sense amplifier 9 and an output signal Q of "H" is output.

There is, however, a problem as described below in the conventional ROM.

Memory cells $1_{i,1}$ to $1_{i,n}$ are connected in parallel between the column line CLi and the ground potential GND. At an read operation, only a single memory cell $1_{i,j}$ selected according to a word line WLj is set on and other memory cells are set off. Since each memory cell $1_{i,j}$ is formed by an NMOS transistor, "off" resistance in an off condition is extremely high compared with "on" resistance in an on condition, though it is impossible to generate a completely non-conducting state to remove leak current in an off condition (which is referred to as "off leak current").

Accordingly, there has been such a problem that if there are a great number of (for example, 1024) memory cells $1_{i,1}$ to $1_{i,n}$ connected in parallel, off leak current flowing through these memory cells totals up to a value equivalent to current flowing through the memory cell in an on condition, by which it becomes hard to judge an electric potential difference by using the sense amplifier 9. Particularly in a mass storage ROM having a micro-structure, ratios of the "off" resistance and the "on" resistance are decreased by an application of a low voltage, which also causes a problem that an appropriate ROM cannot be designed.

According to the invention, there is provided a ROM capable of resolving these problems of the prior art as described above by eliminating effects of off leak current of non-selected memory cells to prevent a read error even if it is a large scale ROM.

SUMMARY OF THE INVENTION

It is an object of the present invention to prevent a read error by decreasing effects of leak current. To achieve the object, a read only memory having a typical constitution of the present invention comprises word lines activated in response to an address signal, sense lines intersected with the word lines and selected in response to a selection signal, a reference sense line intersected with the word lines, memory cells storing data therein, reference memory cells connected to the reference sense line, a sense amplifier for comparing currents flowing on the selected one of the sense lines and on the reference sense line, and a correction current supply circuit connected to the sense lines and the reference sense line, the correction current supply circuit generating a correction current approximately corresponding to a leak current flowing through the memory cells connected to the selected one of the sense lines and providing the correction current to the sense lines and the reference sense line.

DETAILED DESCRIPTION OF THE PREFERRED EMBODIMENTS

Figure 1:
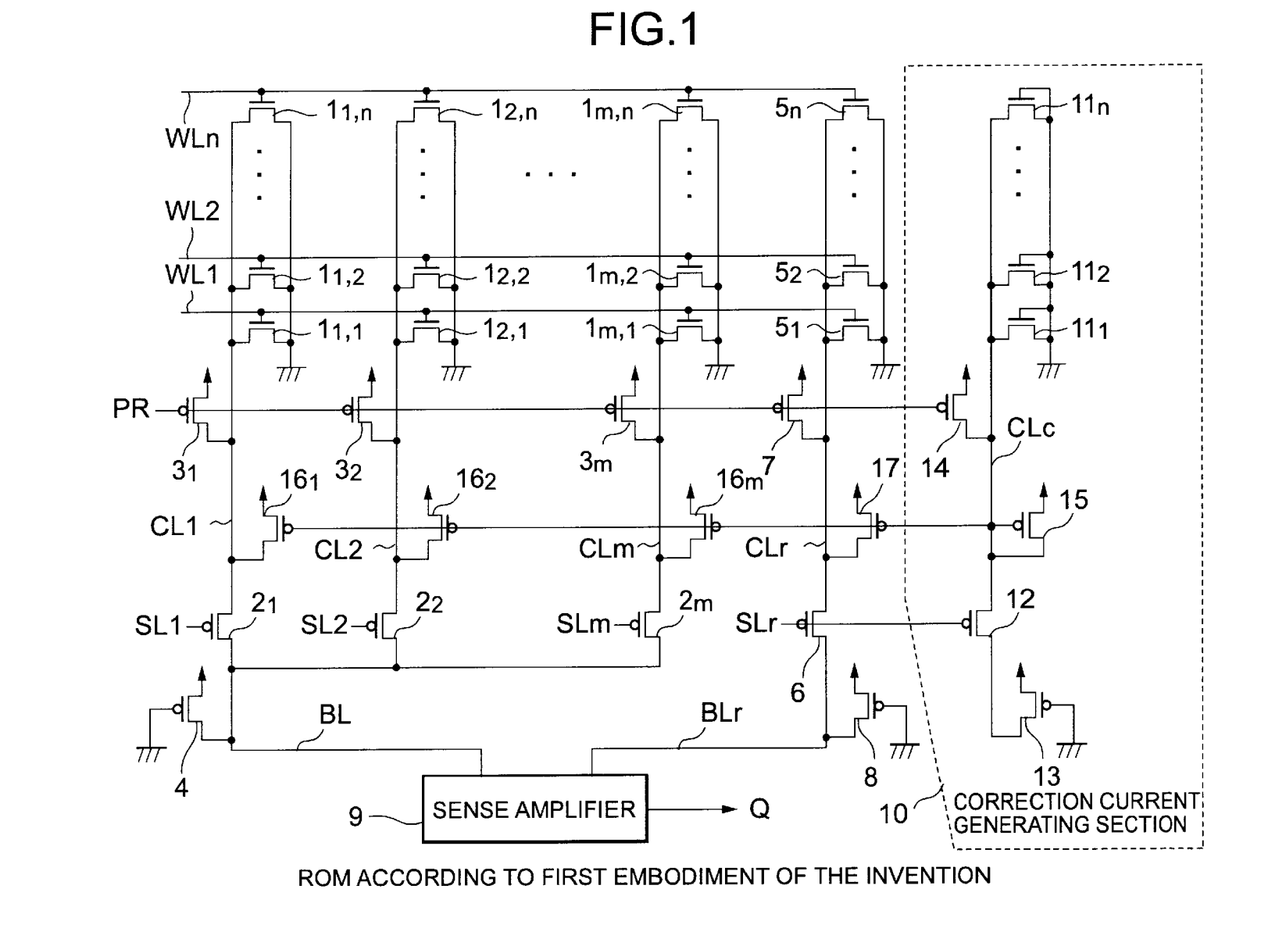
FIG. 1 is a schematic diagram of a ROM according to a first embodiment of the present invention.

Referring to FIG. 1, there is shown a schematic constitutional diagram of a ROM illustrating a first embodiment of the present invention, in which the same reference characters are used for the same elements as those in FIG. 2.

The ROM, in the same manner as a ROM shown in FIG. 2, comprises sense lines (for example, column lines) CLi (i=1 to m) arranged in parallel and selection lines (for example, word lines) WLj (j=1 to n) arranged intersecting these lines. At intersections between the column lines CLi and the word lines WLj, memory cells $1_{i,j}$ formed by NMOS transistors are selectively arranged with drains of the memory cells $1_{i,j}$ connected to the column lines CLi and its gates connected to the word lines WLj. Sources of the memory cells $1_{i,j}$ are connected to common potential (for example, ground potential) GND via a conductive line.

Respective memory cells $1_{i,j}$ are selectively arranged at manufacturing so as to be preset to a logical value "0" or "1." For example, in a contact ROM, a conductive line between a source of a memory cell $1_{i,j}$ and the ground potential GND is connected in a contact layer to set the memory cell to "1" and the source is disconnected (in other words, electrically separated) from the ground potential GND without a formation of the contact layer to set it to "0." In an active ROM, only the memory cell $1_{i,j}$ corresponding to "1," is formed so as not to generate the pattern of the memory cell $1_{i,j}$ corresponding to "0" all along. Therefore, if the selected memory cell $1_{i,j}$ is set to "1," the memory cell $1_{i,j}$ is set on, by which a current flows, while if it is set to "0," current does not flow.

Respective column lines CLi are connected to the bit line BL in common via respective PMOS transistors $2_i$. A column selection signal (for example, a selection signal) SLi is given to a gate of each PMOS transistor $2_i$ and one of the PMOS transistors $2_1$ is selected according to the selection signal SLi so as to be set on. Furthermore, respective column lines CLi are connected to the power supply potential VCC via respective PMOS transistors $3_i$ controlled in common by the precharge signal PR. The bit line BL is connected to the power supply potential VCC via the PMOS transistor 4 which is constantly on.

Furthermore, the ROM has a reference sense line (for example, a reference column line) CLr arranged intersecting word lines WLj. At intersections between the reference column line CLr and respective word lines WLj, reference memory cells $5_j$ formed by MOS transistors are arranged, with drains of the reference memory cells $5_j$ connected to a reference column line CLR and their gates connected to word lines WLj, respectively. Sources of the respective reference memory cells $5_j$ are connected to the ground potential GND. Therefore, all of the reference memory cells $5_j$ are set to "1."

The reference column line CLr is connected to the reference bit line BLr via the PMOS transistor 6 controlled by the selection signal SLr and connected to the power supply potential VCC via the PMOS transistor 7 controlled by the pre-charge signal PR. The reference bit line BLr is connected to the power supply potential VCC via the PMOS transistor 8 which is constantly on.

The bit line BL and the reference bit line BLr are connected to the sense amplifier 9. The sense amplifier 9 amplifies an electric potential difference between the bit line BL and the reference bit line BLr and judges a condition of the memory cell $1_{i,j}$ selected according to the word line WLj and the selection signal SLi to output an output signal Q.

Furthermore, the ROM comprises a correction current supply circuit including a correction current generating section 10 and PMOS transistors $16_1$ to $16_m$ and 17.

The correction current generating section 10 has a correction column line CLc, and NMOS transistors $11_j$ having the same number of articles n as for the memory cells $1_{i,j}$ are connected in parallel between the correction column CLc and the ground potential GND. All of the gates of the NMOS transistors $11_j$ are connected to the ground potential GND and these NMOS transistors $11_j$ are off. Further, all of the NMOS transistors $11_j$ are set to "1."

The correction column line CLc is connected to the power supply potential VCC via a PMOS transistor 12 controlled by the selection signal SLr and a PMOS transistor 13 which is constantly on. The correction column line CLc is connected to the power supply potential VCC via a PMOS transistor 14 controlled by the pre-charge signal PR. The correction column line CLc is connected to a gate and a drain of a PMOS transistor 15 and a source of the PMOS transistor 15 is connected to the power supply potential VCC.

On the other hand, respective column lines CLi are connected to drains of the PMOS transistors $16_i$ and sources thereof are connected to the power supply potential VCC. In addition, gates of the PMOS transistors $16_i$ are connected in common to the correction column line CLc. Respective PMOS transistors $16_i$ form a current mirror circuit to the PMOS transistor 15, having dimensions corresponding to the number of the memory cells $1_{i,1}$ to $1_{i,n}$ connected to the column lines CLi. In the same manner, the reference column line CLr is connected to a drain of the PMOS transistor 17 with a source thereof connected to the power supply potential VCC and a gate connected to the correction column line CLc so as to form a current mirror circuit to the PMOS transistor 15.

Next, an operation of the above ROM will be described below.

In the ROM, it is assumed that the memory cell $1_{1,1}$ is set to "0" and the memory cell $1_{1,2}$ to $1_{1,n}$ are set to "1," for example.

First, respective PMOS transistors $3_1$ to $3_n$, 7, and 14 are set on according to the pre-charge signal PR and the column lines CL1 to CLn, CLr, and CLc are pre-charged.

Subsequently, if the pre-charge signal PR is stopped, "L" is given to the selection signals SL1 and SLr, the column line CL1 and the reference column line CLr are selected, the word line WL1 is selected, and "H" is given, the memory cells $1_{1,1}$ are read out to the bit line BL and the reference memory cell $5_1$ is to the reference bit line BLr, respectively.

The memory cell $1_{1,1}$ is set to "0," and therefore current does not flow through the memory cell $1_{1,1}$. The memory cells $1_{1,2}$ to $1_{1,n}$ connected in parallel between the column line CL1 and the ground potential GND are not selected and therefore all of them are set off. Assuming that off leak current per cell flowing through the memory cells $1_{1,2}$ to $1_{1,n}$ is $I_{off}$ in the condition, a sum of the current flowing through the column line CL1 is $(n-1)I_{off}$.

Since all of the reference memory cells $5_1$ to $5_n$ are set to "1," the reference memory cell $5_1$ selected in the word line WL1 is set on and the non-selected reference memory cells $5_2$ to $5_n$ are set off. Assuming that $I_{on}$ is on current flowing through the memory cell $5_1$ in an on condition, current flowing through the reference column line CLr is equal to $I_{on}+(n-1)I_{off}$. Furthermore, NMOS transistors $11_1$ to $11_n$ are constantly off in the correction current generating section 10 and therefore correction current flowing through the correction column line CLc is equal to $nI_{off}$. While the correction current is supplied from the PMOS transistors 15 and 13, setting for supplying $(n-1)/n$ of the current from the PMOS transistor 15 makes current flowing through the PMOS transistor 15 is equal to $(n-1)I_{off}$.

At this point, PMOS transistors $16_1$ and 17 form a current mirror circuit to the PMOS transistor 15, and therefore if dimensions of gate widths and gate lengths of the PMOS transistors $16_1$, 17, and 15 are equal to each other, the same current as for the PMOS transistor 15 flows through the PMOS transistors $16_1$ and 17. Accordingly, all of the current flowing through the column line CL1 is supplied from the PMOS transistor $16_1$ and not supplied from the PMOS transistor 4 at all. Out of the current flowing through the reference column line CLr, $(n-1)I_{off}$ is supplied from the PMOS transistor 17 and the current supplied from the PMOS transistor 8 is equal to $I_{on}$.

A potential difference between the bit line BL and the reference bit line BLr is amplified by the sense amplifier 9. In this case, an electric potential of the bit line BL is substantially equal to the power supply potential VCC and an electric potential of the reference bit line BLr is lowered by the on current $I_{on}$ flowing through the PMOS transistor 8, and therefore a condition of the selected memory cell $1_{1,1}$ is judged to be "0." As a result, an output signal Q of "L," for example, is output from the sense amplifier 9.

If the word line WL2 is selected and "H" is given next, the memory cell $1_{1,2}$ is read out to the bit line BL and the reference memory cell $5_2$ is to the reference bit line BLr, respectively. The memory cell $1_{1,2}$ is set to "1" and therefore it is set on. Other memory cells $1_{1,3}$ to $1_{1,n}$ connected in parallel between the column line CL1 and the ground potential GND are not selected and therefore all of them are set off. Accordingly, current flowing through the column line CL1 is equal to $I_{on}+(n-2)I_{off}$. Therefore, current supplied from the PMOS transistor 4 is equal to $I_{on-Ioff}$. On the other hand, current flowing through the reference column line CLr is equal to one flowing when the word line WL1 is selected and therefore current supplied from the PMOS transistor 8 is $I_{on}$ only.

A potential difference between the bit line BL and the reference bit line BLr is amplified by the sense amplifier 9. In this case, by previously setting an electric potential of the bit line BL to a value lower than an electric potential of the reference bit line BLr in a condition that there is no off leak, the memory cell $1_{1,1}$ is judged to be "1" in contrast to a selection of the word line WL1 and an output signal Q of "H" is output from the sense amplifier 9.

As described above, the ROM according to the first embodiment comprises the correction current generating section 10 for generating correction current equivalent to off leak current of the memory cells $1_{i,j}$ and the PMOS transistors $16_1$ to $16_m$ and 17 for supplying the correction current to respective column lines CL1 to CLm and to the reference column line CLr. Accordingly, the enables an elimination of effects of the off leak current flowing through the non-selected memory cells $1_{i,j}$ in the column lines CLi and the reference column line CLr, by which advantageously a stable read operation is achieved also in a mass storage ROM in which a great number of memory cells are connected in parallel.

Furthermore, respective PMOS transistors $16_i$ are arranged correspondingly to the column lines CLi, and therefore by changing dimensions of the PMOS transistors $16_i$ so as to match the number of memory cells $1_{i,1}$ to $1_{i,n}$ connected to the column line CLi, off current can be canceled at a high precision advantageously.

Figure 3:
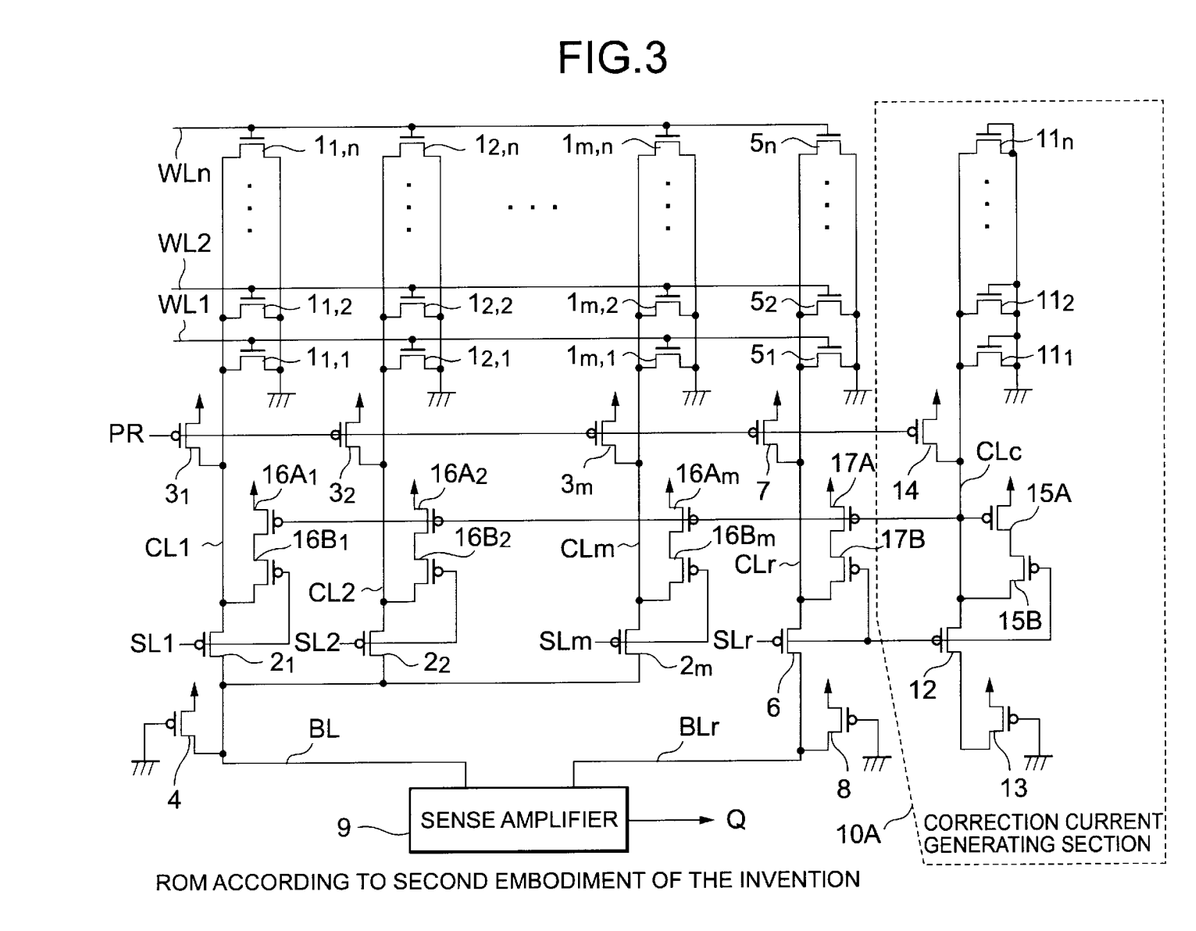
FIG. 3 is a schematic diagram of a ROM according to a second embodiment of the present invention.

Referring to FIG. 3, there is shown a schematic constitutional diagram of a ROM according to a second embodiment of the present invention, with the same reference characters used for the same elements as for those in FIG. 1.

In the ROM, instead of the PMOS transistor 15 in the correction current generating section 10 in FIG. 1, there is provided a correction current generating section 10A with PMOS transistors 15A and 15B connected in series. In addition, a gate of the PMOS transistor 15A is connected to a correction column line CLc and a selection signal SLr is given to a gate of the PMOS transistor 15B. Providing PMOS transistors $16A_i$ and $16B_i$ connected in series instead of PMOS transistors $16_i$, gates of the PMOS transistors $16A_i$ are connected in common to the correction column line CLc and selection signals SLi are given to gate of the PMOS transistors $16B_i$. Furthermore, providing PMOS transistors 17A and 17B connected in series instead of the PMOS transistor 17, a gate of the PMOS transistor 17A is connected to the correction column line CLc and a selection signal SLr is given to a gate of the PMOS transistor 17B. Other configurations are the same as for FIG. 1.

In a ROM shown in FIG. 3, respective PMOS transistors $16A_i$ arranged so as to form a current mirror circuit to the PMOS transistor 15A of the correction current generating section 10A are controlled by the selection signals SLi via the PMOS transistors 16B$_i$ connected in series. Accordingly, correction current is supplied only to the selected column lines CLi and correction current supply to other non-selected column lines is stopped. Other read out operations are the same as for FIG. 1.

Therefore, the ROM according to the second embodiment has an advantage that a power consumption is reduced by stopping unnecessary correction current in addition to the same advantages as those of the first embodiment.

Figure 4:
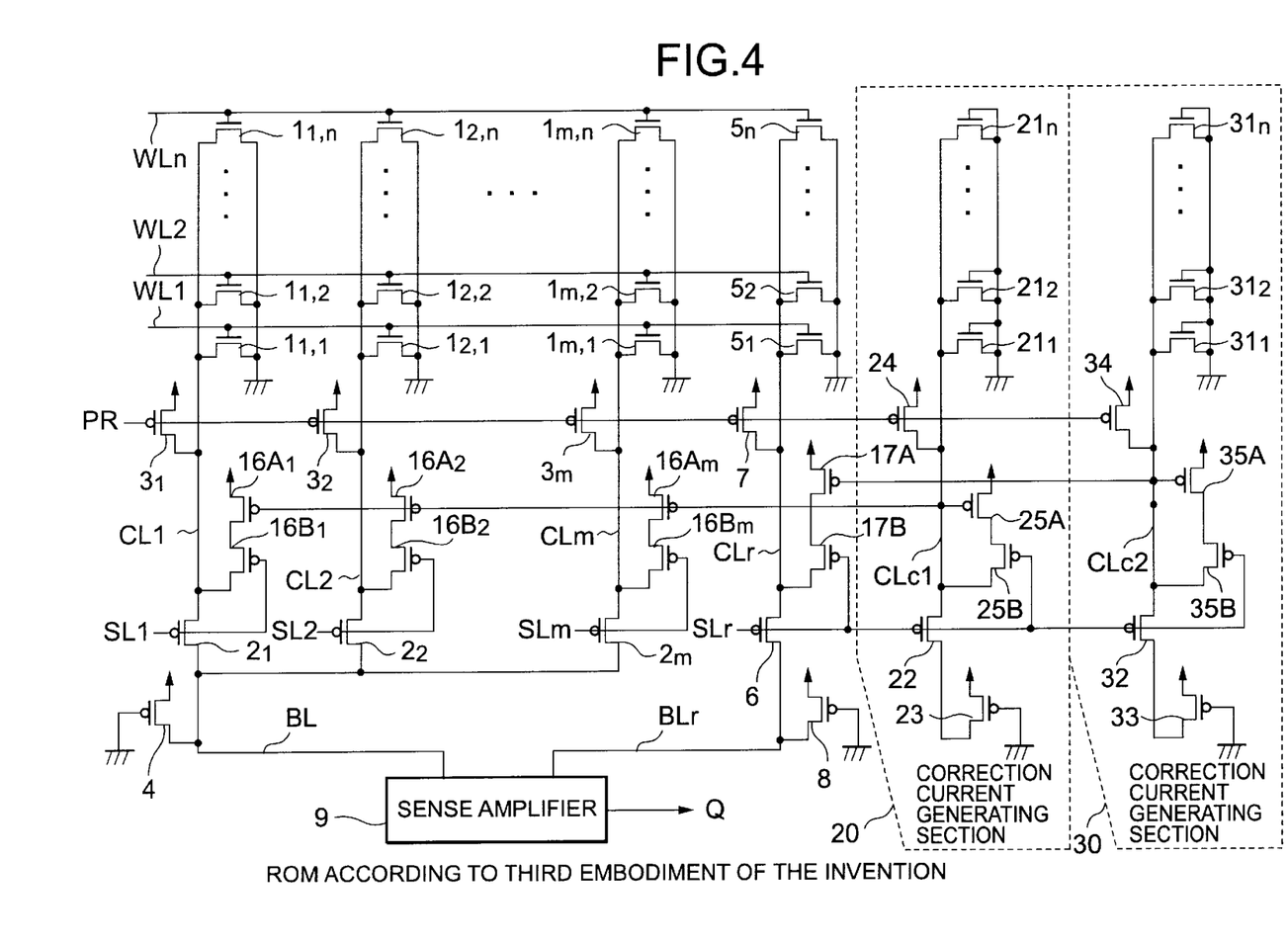
FIG. 4 is a schematic diagram of a ROM according to a third embodiment of the present invention.

Referring to FIG. 4, there is shown a schematic constitutional diagram of a ROM according to a third embodiment of the present invention, with reference characters used for the same elements as those for FIG. 3.

In the ROM, instead of the correction generating section 10A in FIG. 3, there are provided correction current generating sections 20 and 30 having the same configuration. The correction current generating section 20 is used for generating off leak current for correction corresponding to memory cells $1_{i,j}$ in a configuration in which NMOS transistors $21_1$ to $21_n$ having the same dimensions as for the memory cells $1_{i,j}$ connected in parallel between the correction column line CLc1 and the ground potential GND. On the other hand, the correction current generating section 30 is used for generate off leak current for correction corresponding to reference memory cells $5_1$ to $5_n$ in a configuration in which NMOS transistors $31_1$ to $31_n$ having the same dimensions as for the reference memory cells $5_1$ to $5_n$ are connected in parallel between the correction column line CLc2 and the ground potential GND. Other configurations are the same as for FIG. 3.

In the ROM shown in FIG. 4, the correction current generating section 20 corrects off leak current for the selected column line CLi and the correction current generating section 30 corrects off leak current for the reference column line CLr. Other read operations are the same as for FIG. 3.

Therefore, the ROM according to the third embodiment is advantageously capable of supplying appropriate correction current to achieve a read operation at a high precision even if the memory cells $1_{i,j}$ have different dimensions from those of the reference memory cells $5_1$ to $5_n$.

Figure 5:
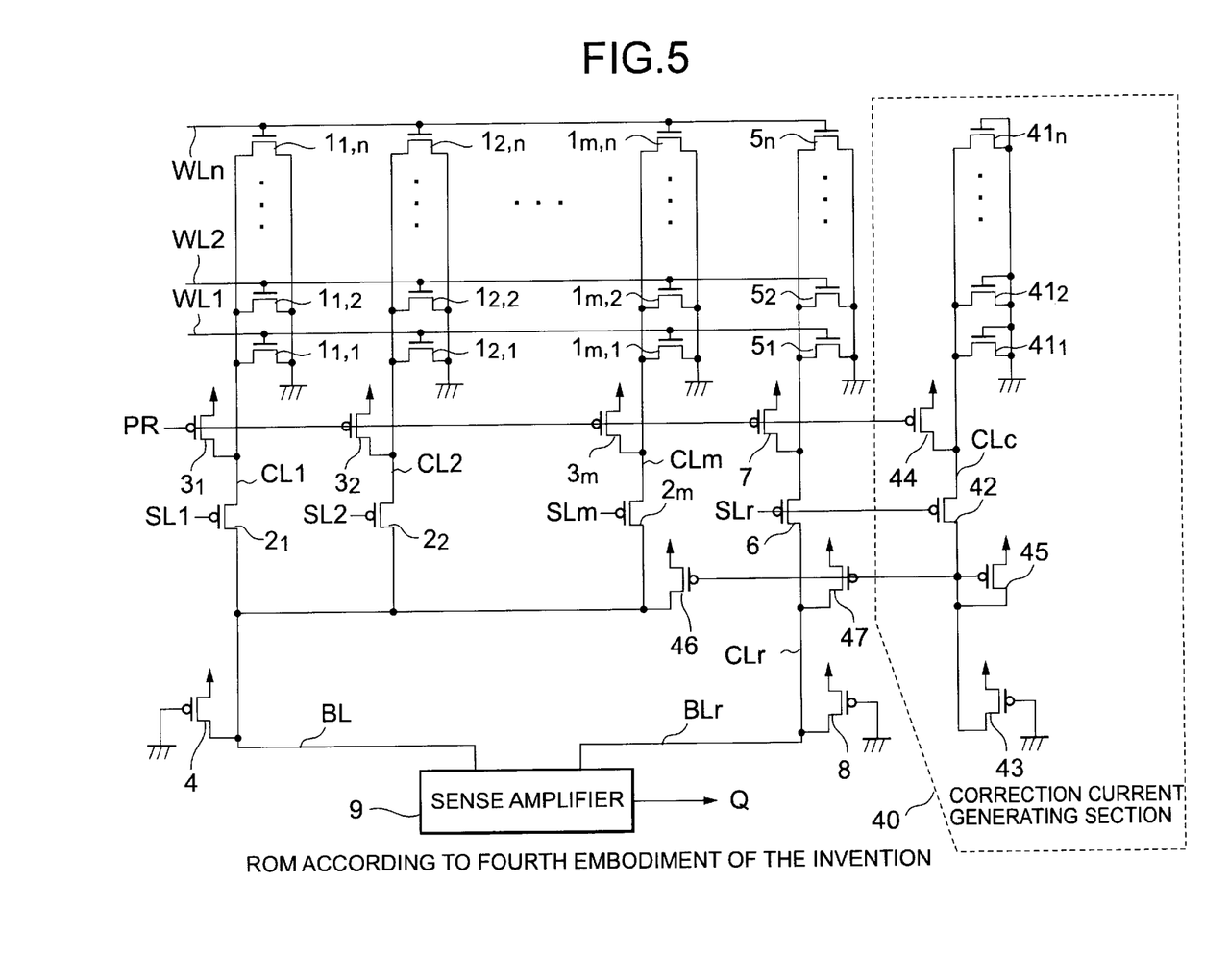
FIG. 5 is a schematic diagram of a ROM according to a fourth embodiment of the present invention.

Referring to FIG. 5, there is shown a schematic constitutional diagram of a ROM according to a fourth embodiment of the present invention, with the same reference characters used for the same elements as for those in FIG. 2.

The ROM has a correction current generating section 40 and PMOS transistors 46 and 47 additionally to the ROM shown in FIG. 2.

The correction current generating section 40 has a correction column line CLc, and NMOS transistors $41_j$ having the same number of articles n as for the memory cells $1_{i,j}$ are connected in parallel between the correction column line CLc and the ground potential GND. All of the gates of NMOS transistors $41_j$ are set off with being connected to the ground potential GND. The correction column line CLc is connected to the power supply potential VCC via a PMOS transistor 42 controlled according to a selection signal SLr and via a PMOS transistor 43 which is constantly on. Furthermore, the correction column line CLc is connected to the power supply potential VCC via a PMOS transistor 44 controlled by a pre-charge signal PR. In addition, the correction column line CLc is connected to a gate and a drain of a PMOS transistor 45 and a source of the PMOS transistor 15 is connected to the power supply potential VCC.

On the other hand, as for the PMOS transistor 46 a drain thereof is connected to a bit line BL, its source is to the power supply potential VCC, and its gate is to the correction column line CLc, forming a current mirror circuit to the PMOS transistor 45. In the same manner, regarding the PMOS transistor 47 a drain thereof is connected to the reference column line CLr, its source is to the power supply potential VCC, and its gate is to the correction column line CLc, forming a current mirror circuit to the PMOS transistor 45.

In the ROM shown in FIG. 5, correction current is supplied to the bit line BL and the reference bit line BLr by the PMOS transistors 46 and 47 arranged so as to form a current mirror circuit to the PMOS transistor 45 of the correction current generating section 40, respectively. Other read operations are the same as for FIG. 1.

Therefore, the ROM according to the fourth embodiment is advantageously capable of eliminating effects of off leak current at a high precision in a simple circuit configuration, by which a stable read operation is achieved also in a mass storage ROM in which a great number of memory cells are connected in parallel.

The present invention is not limited to the above embodiments and various alterations are permitted. Regarding these alterations, there are the following examples (a) to (f):

(a) While the PMOS transistor 12 shown in FIG. 3, the PMOS transistors 22 and 32 in FIG. 4, and the PMOS transistor 42 in FIG. 5 are configured so as to be controlled by the same selection signal SLr as for the PMOS transistor 6, they can be set so as to be constantly on. If these settings are applied, the levels of the correction column lines CLc, CLc1, and CLc2 are constantly stable at relatively low levels, and therefore the levels of the bit line BL and the reference bit line BLr are easily increased. Therefore, a decrease of levels of the column lines CL1 to CLm, the reference column line CLr, the bit line BL, and the reference bit line BLr can be quickly canceled.

(b) While the gate of the PMOS transistor 45 in FIG. 5 is connected to the source side of the PMOS transistor 42, it can be connected to the drain side of the PMOS transistor 42. The enhances a current supply capacity of the PMOS transistor 45, thereby decreasing the dimensions of the PMOS transistors 45, 46, and 47.

(c) It is also possible to delete the PMOS transistor 45 in FIG. 5 and to connect gates of the PMOS transistors 46 and 47 to the correction column line CLc. The simplifies the circuit and enhances the current supply capacity of the PMOS transistors 46 and 47, thereby further decreasing the dimensions thereof.

(d) If the current supply capacity of the PMOS transistor 15 (or the PMOS transistors 15A and 15B) in FIGS. 1 and 3 is extremely higher than those of the PMOS transistors 12 and 13, these PMOS transistors 12 and 13 can be deleted. It is the same for the PMOS transistors 22, 23, 32, and 33 and the PMOS transistor 43 in FIG. 5.

(e) The PMOS transistors 15B and 17B in FIG. 3 and the PMOS transistors 17B, 25B, and 35B in FIG. 4 can be omitted by setting other circuit parameters so as to achieve a predetermined amount of correction current.

(f) While each of the PMOS transistors 161 to 16m in FIG. 1, the PMOS transistors $16A_1$ to $16A_m$ in FIGS. 3 and 4, and the PMOS transistor 46 in FIG. 5 is configured as a single PMOS transistor, it is also possible to apply a configuration in which PMOS transistors having the same size are arranged in parallel to connect the required number of PMOS transistors according to an amount of correction current to be supplied to the bit lines BL1 to BLm. This makes it possible to flexibly cope with a wide difference of the correction current supplied to the bit lines BL1 to BLm without any change of dimensions of a conductive line or the like.

As described above in detail, according to a first aspect of the invention, there is provided a ROM comprising correction current supply circuit for generating correction current corresponding to off leak current flowing through non-selected memory cells connected to sense lines and to a reference sense line to supply the correction current to the sense lines and to the reference sense line. The eliminates effects of the off leak current flowing through the sense line and the reference sense line, by which a condition of the selected memory cell is read out by a sense amplifier without any error.

According to a second aspect of the invention, the correction current supply circuit comprises MOS transistors for correction connected in parallel having the same number of articles as for selection lines, first MOS transistors for supplying off leak current flowing through them, and second and third MOS transistors forming a current mirror circuit to the first MOS transistor. This makes it possible to supply precise correction current from the second and third MOS transistors to the sense lines and the reference sense line.

According to a third aspect of the invention, there is provided a second MOS transistor forming a current mirror circuit to the first MOS transistor for each column line for sense lines having column lines. This makes it possible to supply the optimum first correction current to each column line, thereby resolving the problem of read errors also in a mass storage ROM.

According to a fourth aspect of the invention, there is provided a ROM having a configuration in which the first correction current for the sense lines is independent of a generating circuit of the second correction current for the reference sense line. This makes it possible to generate precise correction current corresponding to each of them even if memory cells have difference dimensions from those of the reference memory cell.

What is claimed is:

1. A read only memory comprising:
   a plurality of word lines arranged in a first direction, one of said word lines activated in response to an address signal;
   a plurality of sense lines arranged in a second direction so that said word lines and said sense lines are intersected, one of said sense lines selected in response to a selection signal;
   a reference sense line arranged in the second direction so that said word lines and said reference sense line are intersected;
   a plurality of memory cells storing data therein arranged at intersections between said word lines and said sense lines, wherein one of said memory cells connected the activated one of said word lines and the selected one of said sense lines is selected;
   a plurality of reference memory cells arranged at intersections between said word lines and said reference sense line;
   a sense amplifier for comparing currents flowing on the selected one of said sense lines and on said reference sense line so that the data stored in said selected one of said memory cells is detected; and
   a correction current supply circuit operatively coupled to said sense lines and said reference sense line, said correction current supply circuit generating a correction current approximately corresponding to a leak current flowing through said memory cells connected to the selected one of said sense lines and providing the correction current to said sense lines and said reference sense line.

2. A read only memory according to claim 1, wherein said correction current supply circuit comprises
   a correction current generating circuit including a plurality of transistors which provide the correction current, and
   a current mirror circuit connected to the connection current generating circuit, said sense lines and said reference sense line, the current mirror circuit providing the correction current to said sense lines and said reference sense line in response to the correction current generated by the correction current generating circuit.

3. A read only memory according to claim 1, wherein each of said memory cells includes a transistor having a gate connected to one of said word line, a first terminal connected to one of said sense lines and a second terminal connected to a voltage source.

4. A read only memory according to claim 1, wherein each of said reference memory cells includes a transistor having a gate connected to one of said word line, a first terminal connected to said reference sense line and a second terminal connected to a voltage source.

5. A read only memory comprising:
   a memory cell array including
      a plurality of word lines arranged in a first direction, wherein one of said word lines is activated in response to an address signal,
      a plurality of memory columns each of which has a sense line arranged in a second direction and a plurality of memory cell transistors, each of the memory cell transistors having a gate connected to one of said word lines, a first terminal connected to a first potential source and a second terminal connected to the sense line, and
      a reference memory column having a reference sense line arranged in the second direction and a plurality of reference cell transistors each of which has a gate connected to one of said word lines, a first terminal connected to the first potential source and a second terminal connected to the reference sense line;
   a sense line selection circuit connected to the sense lines for selecting one of the sense lines in response to a selection signal;
   a sense amplifier connected to said sense line selection circuit and the reference sense line, said sense amplifier comparing currents flowing on the selected one of the sense lines and on the reference sense line; and
   a correction current supply circuit operatively coupled to the sense lines and said reference sense line, said correction current supply circuit generating a correction current approximately corresponding to a leak current flowing through said memory cell transistors of one of the memory columns and providing the correction current to said sense lines and said reference sense line.

6. A read only memory according to claim 5, wherein said correction current supply circuit comprises
   a correction current generating circuit including a correction memory column having a correction line arranged in the second direction and a plurality of correction cell transistors each of which has a gate and a first terminal connected to the first potential source and a second terminal connected to the correction line; and a current mirror circuit connected to the correction current generating circuit, the sense lines and the reference sense line, the current mirror circuit providing the correction current to the sense lines and the reference sense line in response to the correction current generated by the correction current generating circuit.

7. A read only memory according to claim 5, further comprising a pre-charge circuit connected to the sense lines and the reference sense line, said pre-charge circuit charging the sense lines and the reference sense line in response to a pre-charge signal.

8. A read only memory according to claim 5, further comprising a potential supply circuit connected to said sense line selection circuit and the reference sense line, said potential supply circuit providing a potential from a second potential source to the selected one of the sense lines and the reference sense line.

9. A read only memory according to claim 6, wherein the current mirror circuit includes a first transistor having a gate and a first terminal connected to the correction line and a second terminal connected to a second voltage source, a second transistor having a gate connected to the gate of the first transistor, a first terminal connected to the reference sense line and a second terminal connected to the second voltage source, and a plurality of third transistors each of which has a gate connected to the gate of the first transistor, a first terminal connected to one of the sense lines and a second terminal connected to the second voltage source.

10. A read only memory according to claim 6, wherein the current mirror circuit includes a first transistor having a gate connected to the correction line, a first terminal and a second terminal connected to a second voltage source, a second transistor having a gate connected to receive the selection signal, a first terminal connected to the gate of the first transistor and a second terminal connected to the first terminal of the first transistor, a third transistor having a gate connected to the gate of the first transistor, a first terminal and a second terminal connected to the second voltage source, a fourth transistor having a gate connected to receive the selection signal, a first terminal connected to the reference sense line and a second terminal connected to the first terminal of the third transistor, a plurality of fifth transistors each of which has a gate connected to, a first terminal and a second terminal connected to the second voltage source, and a plurality of sixth transistors each of which has a gate connected to receive the selection signal, a first terminal connected to one of the sense lines and a second terminal connected to one of the first terminal of the fifth transistors.

11. A read only memory according to claim 5, wherein said correction current supply circuit comprises a first correction current generating circuit including a first correction memory column having a first correction line arranged in the second direction and a plurality of first correction cell transistors each of which has a gate and a first terminal connected to the first potential source and a second terminal connected to the first correction line, a first current mirror circuit connected to the first correction current generating circuit and the reference sense line, said first current mirror circuit providing the correction current to the reference sense line in response to a first correction current generated by said first correction current generating circuit, a second correction current generating circuit including a second correction memory column having a second correction line arranged in the second direction and a plurality of second correction cell transistors each of which has a gate and a first terminal connected to the first potential source and a second terminal connected to the second correction line, and a second current mirror circuit connected to the second correction current generating circuit and the sense lines, said second current mirror circuit providing the correction current to the sense lines in response to a second correction current generated by said second correction current generating circuit.

12. A read only memory according to claim 5, wherein each of said memory cell transistors selectively stores data "0" or "1", and wherein one of the memory cell transistors turns on when it stores data "1" and receives an active signal to the gate thereof, and another one of the memory cell transistors does not turn on when it stores data "0" and receives the active signal to the gate thereof.

13. A read only memory according to claim 12, wherein the reference memory cells storing data "1".

14. A read only memory according to claim 12, wherein the correction memory cells storing data "1".

15. A read only memory comprising:

a memory cell array including a plurality of word lines arranged in a first direction, wherein one of said word lines is activated in response to an address signal, a plurality of memory columns each of which has a sense line arranged in a second direction and a plurality of memory cell transistors, each of the memory cell transistors having a gate connected to one of said word lines, a first terminal connected to a first potential source and a second terminal connected to the sense line, and a reference memory column having a reference sense line arranged in the second direction and a plurality of reference cell transistors each of which has a gate connected to one of said word lines, a first terminal connected to the first potential source and a second terminal connected to the reference sense line;

a first bit line selectively connected to one of the sense lines in response to a selection signal;

a second bit line selectively connected to the reference sense lines in response to the selection signal;

a sense amplifier connected to said first and second bit lines, said sense amplifier comparing currents flowing on said first and second bit lines; and a correction current supply circuit operatively coupled to said first and second bit lines, said correction current supply circuit generating a correction current approximately corresponding to a leak current flowing through said memory cell transistors of one of the memory columns and providing the correction current to said first and second bit lines.

16. A read only memory according to claim 15, wherein said correction current supply circuit comprises a correction current generating circuit including a correction memory column having a correction line arranged in the second direction and a plurality of correction cell transistors each of which has a gate and a first terminal connected to the first potential source and a second terminal connected to the correction line; and a current mirror circuit connected to the correction current generating circuit and said first and second bit lines, said current mirror circuit providing the correction current to the first and second bit lines in response to the correction current generated by the correction current generating circuit.

17. A read only memory according to claim 15, further comprising a pre-charge circuit connected to the sense lines and the reference sense line, said pre-charge circuit charging the sense lines and the reference sense line in response to a pre-charge signal.

18. A read only memory according to claim 15, further comprising a potential supply circuit connected to said first and second bit lines, said potential supply circuit providing a potential from a second potential source said first and second bit lines.

19. A read only memory according to claim 16, wherein the current mirror circuit includes a first transistor having a gate and a first terminal connected to the correction line and a second terminal connected to a second voltage source, a second transistor having a gate connected to the gate of the first transistor, a first terminal connected to said first bit line and a second terminal connected to the second voltage source, and a third transistor having a gate connected to the gate of the first transistor, a first terminal connected to said second bit line and a second terminal connected to the second voltage source.

* * * * *